(12) United States Patent
Lung (10) Patent No.: US 7,696,506 B2
(45) Date of Patent: Apr. 13, 2010

(54) MEMORY CELL WITH MEMORY MATERIAL INSULATION AND MANUFACTURING METHOD

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 7 days.

(21) Appl. No.: 11/426,771

(22) Filed: Jun. 27, 2006

(65) Prior Publication Data

US 2007/0298535 A1    Dec. 27, 2007

(51) Int. Cl.
*H01L 47/00*    (2006.01)
(52) U.S. Cl. ............. 257/4; 257/2; 257/3; 257/E47.001
(58) Field of Classification Search ........................ 257/4
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 4,959,812 A | 9/1990 | Momodomi et al. | |
| 5,106,775 A * | 4/1992 | Kaga et al. | 438/155 |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |
| 5,515,488 A | 5/1996 | Stephens, Jr. | |
| 5,534,712 A | 7/1996 | Ovshinsky et al. | |
| 5,550,396 A * | 8/1996 | Tsutsumi | 257/330 |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |

(Continued)

FOREIGN PATENT DOCUMENTS

WO    WO 00/45108 A1    8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Kenneth A Parker
*Assistant Examiner*—Anthony Ho
(74) *Attorney, Agent, or Firm*—Haynes Beffel & Wolfeld LLP (57) ABSTRACT

A memory cell, the memory cell includes first and second electrodes and a memory material element electrically coupling the first and second electrodes. The memory material element comprises a first memory material, such as GST, the first memory material having an electrical property that can be changed by the application of energy. A thermal insulating layer surrounds the memory material element. The thermal insulating layer comprises a second memory material. A dielectric layer separates the thermal insulating material from the memory material element. A method for making a thermally insulated memory cell device is also disclosed.

28 Claims, 6 Drawing Sheets

U.S. PATENT DOCUMENTS

| | | | |
|---|---|---|---|
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A | 2/2000 | Harshfield | |
| 6,034,882 A | 3/2000 | Johnson et al. | |
| 6,066,870 A | 5/2000 | Siek | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| 6,242,336 B1 | 6/2001 | Ueda et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,462,353 B1 | 10/2002 | Gilgen | |
| 6,473,332 B1 | 10/2002 | Ignatiev et al. | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 * | 4/2003 | Maeda | 438/143 |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,620,715 B1 | 9/2003 | Blosse et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,744,088 B1 | 6/2004 | Dennison | |
| 6,746,892 B2 | 6/2004 | Lee et al. | |
| 6,750,079 B2 | 6/2004 | Lowrey et al. | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,805,563 B2 | 10/2004 | Xu | |
| 6,808,991 B1 | 10/2004 | Tung et al. | |
| 6,815,704 B1 | 11/2004 | Chen | |
| 6,830,952 B2 | 12/2004 | Lung et al. | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,888,750 B2 | 5/2005 | Walker et al. | |
| 6,894,304 B2 | 5/2005 | Moore | |
| 6,894,305 B2 | 5/2005 | Yi et al. | |
| 6,903,362 B2 | 6/2005 | Wyeth et al. | |
| 6,909,107 B2 | 6/2005 | Rodgers et al. | |
| 6,927,410 B2 | 8/2005 | Chen | |
| 6,933,516 B2 | 8/2005 | Xu | |
| 6,936,840 B2 | 8/2005 | Sun et al. | |
| 6,937,507 B2 | 8/2005 | Chen | |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,992,932 B2 | 1/2006 | Cohen | |
| 7,023,009 B2 | 4/2006 | Kostylev et al. | |
| 7,033,856 B2 | 4/2006 | Lung et al. | |
| 7,042,001 B2 * | 5/2006 | Kim et al. | 257/3 |
| 7,067,864 B2 | 6/2006 | Nishida et al. | |
| 7,067,865 B2 | 6/2006 | Lung et al. | |
| 7,122,281 B2 | 10/2006 | Pierrat | |
| 7,122,824 B2 | 10/2006 | Khouri et al. | |
| 7,126,149 B2 | 10/2006 | Iwasaki et al. | |
| 7,132,675 B2 | 11/2006 | Gilton | |
| 7,164,147 B2 | 1/2007 | Lee et al. | |
| 7,166,533 B2 | 1/2007 | Happ | |
| 7,214,958 B2 | 5/2007 | Happ | |
| 7,220,983 B2 | 5/2007 | Lung | |
| 7,277,317 B2 | 10/2007 | Le Phan et al. | |
| 2001/0055838 A1 | 12/2001 | Walker et al. | |
| 2002/0070457 A1 | 6/2002 | Sun et al. | |
| 2002/0072223 A1 | 6/2002 | Gilbert et al. | |
| 2002/0081833 A1 | 6/2002 | Li et al. | |
| 2002/0113273 A1 | 8/2002 | Hwang et al. | |
| 2002/0182835 A1 | 12/2002 | Quinn | |
| 2004/0051094 A1 | 3/2004 | Ooishi | |
| 2004/0051161 A1 | 3/2004 | Tanaka et al. | |
| 2004/0165422 A1 | 8/2004 | Hideki et al. | |
| 2004/0178172 A1 | 9/2004 | Huang et al. | |
| 2004/0208038 A1 | 10/2004 | Idehara | |
| 2004/0248339 A1 | 12/2004 | Lung | |
| 2005/0018526 A1 | 1/2005 | Lee | |
| 2005/0019975 A1 | 1/2005 | Lee et al. | |
| 2005/0029502 A1 | 2/2005 | Hudgens | |
| 2005/0062087 A1 | 3/2005 | Chen et al. | |
| 2005/0093022 A1 | 5/2005 | Lung | |
| 2005/0106919 A1 | 5/2005 | Layadi et al. | |
| 2005/0112851 A1 | 5/2005 | Lee et al. | |
| 2005/0130414 A1 * | 6/2005 | Choi et al. | 438/672 |
| 2005/0136594 A1 | 6/2005 | Kim | |

| | | |
|---|---|---|
| 2005/0167656 A1 | 8/2005 | Sun et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0215009 A1 | 9/2005 | Cho |
| 2005/0285096 A1* | 12/2005 | Kozicki .................... 257/3 |
| 2006/0038221 A1 | 2/2006 | Lee et al. |
| 2006/0043617 A1 | 3/2006 | Abbott |
| 2006/0073642 A1 | 4/2006 | Yeh et al. |
| 2006/0076641 A1 | 4/2006 | Cho et al. |
| 2006/0091476 A1* | 5/2006 | Pinnow et al. ............ 257/379 |
| 2006/0108667 A1 | 5/2006 | Lung |
| 2006/0110878 A1 | 5/2006 | Lung et al. |
| 2006/0118913 A1 | 6/2006 | Yi et al. |
| 2006/0154185 A1 | 7/2006 | Ho et al. |
| 2006/0175599 A1 | 8/2006 | Happ |
| 2006/0226409 A1 | 10/2006 | Burr et al. |
| 2006/0234138 A1 | 10/2006 | Fehlhaber et al. |
| 2006/0281216 A1 | 12/2006 | Chang et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0010054 A1 | 1/2007 | Fan et al. |
| 2007/0030721 A1 | 2/2007 | Segal et al. |
| 2007/0037101 A1 | 2/2007 | Morioka |
| 2007/0096162 A1* | 5/2007 | Happ et al. ................ 257/246 |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0224726 A1 | 9/2007 | Chen et al. |
| 2007/0235811 A1 | 10/2007 | Furukawa et al. |
| 2007/0246699 A1 | 10/2007 | Lung |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2008/0014676 A1 | 1/2008 | Lung et al. |

FOREIGN PATENT DOCUMENTS

| | | |
|---|---|---|
| WO | WO 00/79539 A1 | 12/2000 |
| WO | WO 01/45108 A1 | 6/2001 |
| WO | 02/25733 | 3/2002 |

OTHER PUBLICATIONS

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3$^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43$^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era- vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Gibson, G.A. et al., "Phase-change Recording Medium that Enables Ultrahigh-density Electron-beam Data Storage," Applied Physics Letter, 2005, 3 pp., vol. 86.

Happ, T.D. et al., "Novel None-Mask Self-Heating Pillar Phase Change Memory," 2006 Symposium on VLSI Technology, 2 pp.

Hudgens, S. et al., "Overview of Phase-Change Chalcogenide Nonvolatile Memory Technology," MRS Bulletin, Nov. 2004, pp. 829-832.

"Magnetic Bit Boost," www.sciencenews.org <http://www.sciencenews.org>, Dec. 18 & 25, 2004, p. 389, vol. 166.

"New Memories Tap Spin, Gird for Battle," Science News, Apr. 3, 1999, p. 223, vol. 155.

Pirovano, Agostino et al., "Reliability Study of Phase-Change Nonvolatile Memories," IEEE Transactions on Device and Materials Reliability, Sep. 2004, pp. 422-427, vol. 4, No. 3.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Wuttig, Matthias, "Towards a Universal Memory?" Nature Materials, Apr. 2005, pp. 265-266, vol. 4.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90nm Phase Change Technology with μTrench and Lance Cell Elements," VLSI Technology, Systems and Applications, Apr. 23-25, 2007, pp. 1-2.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

* cited by examiner

MEMORY CELL WITH MEMORY MATERIAL INSULATION AND MANUFACTURING METHOD

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on memory materials, in particular phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and by reducing the size of the contact area between electrodes and the phase change material so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meet tight specifications needed for large-scale memory devices. It is desirable therefore to provide a memory cell structure having small dimensions and low reset currents, and a method for manufacturing such structure.

SUMMARY OF THE INVENTION

A first aspect of the present invention relates to a memory cell, the memory cell being part of a memory cell device. The memory cell includes first and second electrodes and a memory material element electrically coupling the first and second electrodes. The memory material element comprises a first memory material, such as GST, the first memory material having an electrical property that can be changed by the application of energy. A thermal insulating layer surrounds the memory material element. The thermal insulating layer comprises a second memory material. A dielectric layer separates the thermal insulating material from the memory material element.

In some embodiments the second memory material is electrically isolated from at least one of the first and second electrodes. The second memory material may be at least a 10% better thermal insulator than the dielectric layer. In addition, the thermal expansion coefficient of the second memory material may be within 5% of the thermal expansion coefficient of the first memory material.

A second aspect of the present invention relates to a method for making a thermally insulated memory cell device. A memory cell access layer, comprising an upper surface with an electrically conductive element at the upper surface, is formed. A first electrode layer is deposited on the upper surface of the memory cell access layer and in contact with the electrically conductive element. A memory material layer is formed on the first electrode layer over the electrically conductive element, the memory material layer comprising a first memory material. A second electrode layer is formed on the memory material layer. A first mask is formed over a portion of the second electrode layer overlying the electrically conductive element. Unmasked portions of the second electrode layer and the memory material layer are etched to create a second electrode element and a memory material element. A dielectric material layer is deposited on the second electrode element, the memory material element and the first electrode layer. A thermally insulating, second memory material is deposited on the dielectric material layer. The second electrode element is exposed. An electrically conductive material is deposited onto the exposed second electrode element. A second mask is formed over the second electrode element. Material not masked by the second mask is etched down to the memory cell access layer. A thermal insulation memory material layer is formed from the second memory material surrounding the memory material element. A first electrode is formed from the first electrode layer. A second electrode is formed from the second electrode layer and a masked portion of the electrically conductive material, the memory material element located between the first and second electrodes. A dielectric material is deposited onto the memory cell access layer and against the thermal insulation memory material layer. The second electrode is exposed and an electrically conductive material is deposited onto and in contact with the second electrode.

In some embodiments a clean interface between the first electrode and the memory material element is promoted by maintaining a vacuum environment while depositing at least a portion of the first electrode layer and the memory material layer.

The method described herein for formation of the phase change gate, for use in a memory cell in a phase change random access memory (PCRAM) device, can be used to make small phase change gates, bridges or similar structures for other devices.

Various features and advantages of the invention will appear from the following description in which the preferred embodiments have been set forth in detail in conjunction with the accompanying drawings.

BRIEF DESCRIPTION OF THE DRAWINGS

FIGS. 2-16 illustrate a method for making memory cell devices, such as one incorporating the memory cell of FIG. 1;

DETAILED DESCRIPTION

The following description of the invention will typically be with reference to specific structural embodiments and methods. It is to be understood that there is no intention to limit the invention to the specifically disclosed embodiments and methods but that the invention may be practiced using other features, elements, methods and embodiments. Like elements in various embodiments are commonly referred to with like reference numerals.

Figure 1:
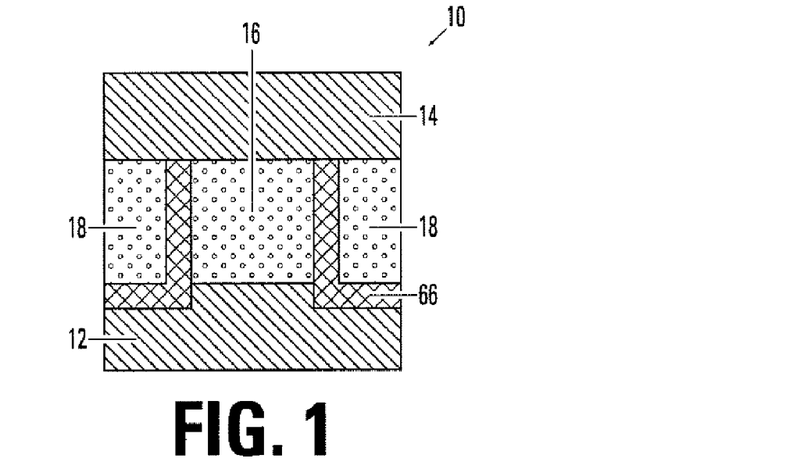
FIG. 1 is a simplified cross-sectional view of one embodiment of a memory cell made according to the invention.

FIG. 1 is a simplified cross-sectional view of a memory cell 10 made according to one embodiment of the invention. Memory cell 10 includes first and second electrodes 12, 14. A memory material element 16, made of a memory material such as a phase change material, electrically couples electrodes 12, 14. A thermal insulation material 18 surrounds memory material element 16 and helps to improve the operational efficiency of memory cell 10 by reducing the reset power requirement. Thermal insulation material 18 is made of a memory material having good insulation qualities, including good thermal stability and a lower thermal conductivity than commonly used oxides such as $SiO_2$. Further, such material provides a similar coefficient of thermal expansion to that of the phase change material, preferably within 5%, reducing thermal stress caused by processing after formation of the memory cell.

Figure 2:
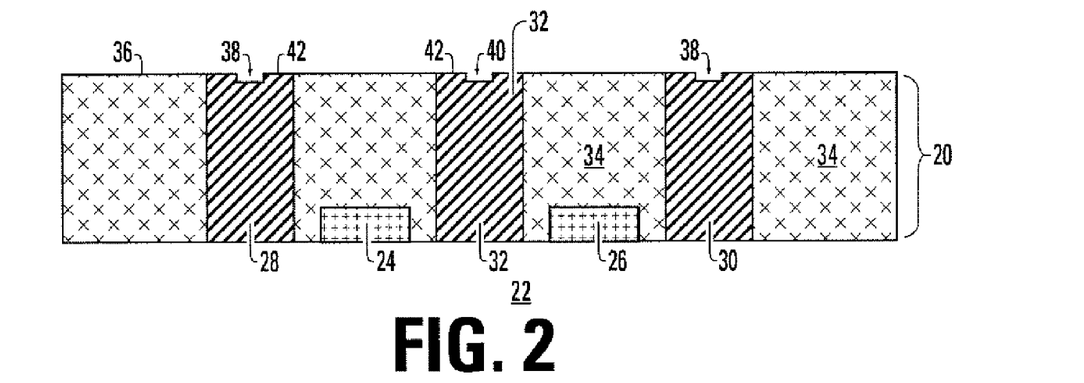
FIG. 2 illustrates the final stages for making a memory cell access layer.

Memory cell 10 and its method of manufacture will be described with reference to FIGS. 2-16. Referring now to FIG. 2, a memory cell access layer 20 is shown formed on a substrate 22. Access layer 20 typically comprises access transistors; other types of access devices may also be used. Access layer 20 comprises first and second polysilicon word lines acting as first and second gates 24, 26, first and second plugs 28, 30 and a common source line 32 all within a dielectric film layer 34. Memory cell access layer 20 is seen to have a generally flat upper surface 36, the upper surface being interrupted by voids 38 formed in plugs 28, 30 and by void 40 formed in common source line 32. Voids 38, 40, or other surface imperfections, are formed as an artifact of the deposition process. Deposition of, for example, a phase change material directly onto the upper surfaces 42 of plugs 28, 30 can create a distribution problem, that is create an increased variance in the operational characteristics of the devices, due to the existence of voids 38.

Figure 3:
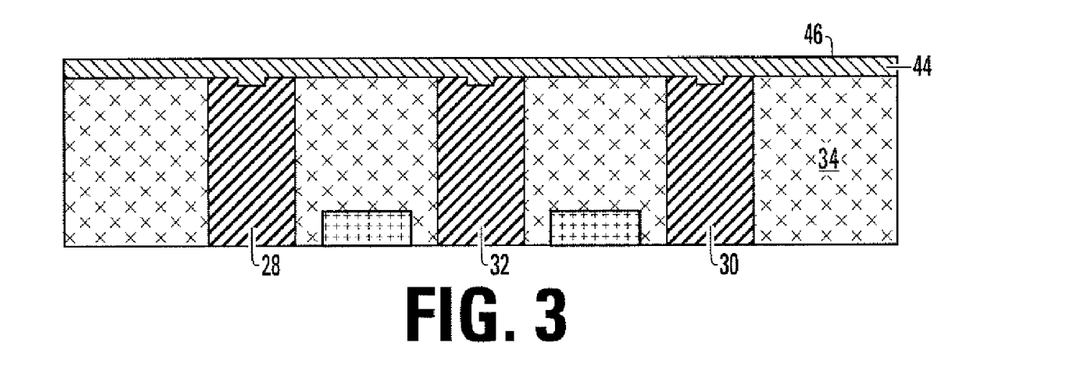
FIG. 3 illustrates the deposition of a first electrode layer on top of the memory cell access layer of FIG. 2.
Figure 4:
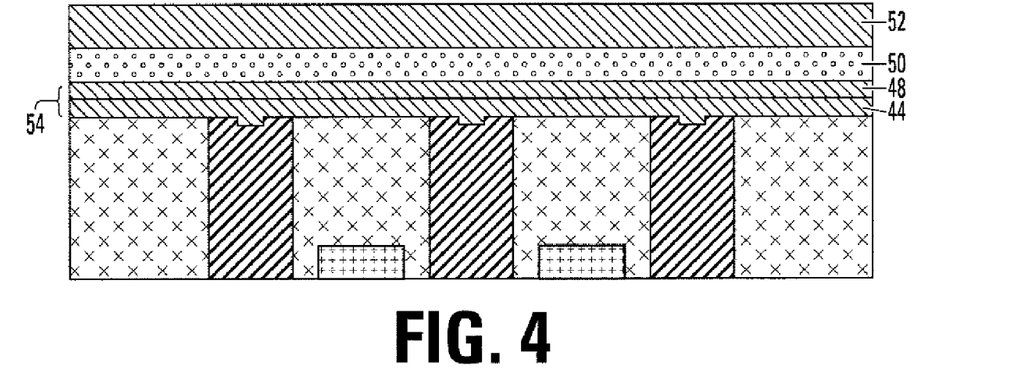
FIG. 4 illustrates the result of depositing several layers onto the first electrode layer of FIG. 3.

FIG. 3 illustrates the results of TiN deposition to create an initial first electrode layer 44 and CMP of layer 44 to create a planarized surface 46. Initial first electrode layer 44 fills voids 38, 40 to effectively eliminate the distribution problem that could be created by the voids or other surface imperfections. FIG. 4 illustrates the result of the deposition of a supplemental first electrode layer 48 of, in this embodiment, TiN, and a memory material layer 50 and a second electrode layer 52. Initial and supplemental first electrode layers 44, 48 create a first electrode layer 54. Memory material layer 50 is deposited in situ on the supplemental first electrode layer 48 without breaking the vacuum, providing a clean interface between supplemental first electrode layer 48 and memory material layer 50 and therefore between first electrode 54 and memory material layer 50. Layer 54 is preferably about 40 to 120 nm thick, typically about 80 nm thick. Memory material layer 50 is made of a memory material, discussed in more detail below, typically a phase change material such as GST. Memory material layer 50 is preferably about 20 to 100 nm thick, typically about 80 nm thick. Second electrode layer 52 is, in this embodiment, TiN and is preferably about 40 to 100 nm thick, typically about 70 nm thick.

Figure 5:
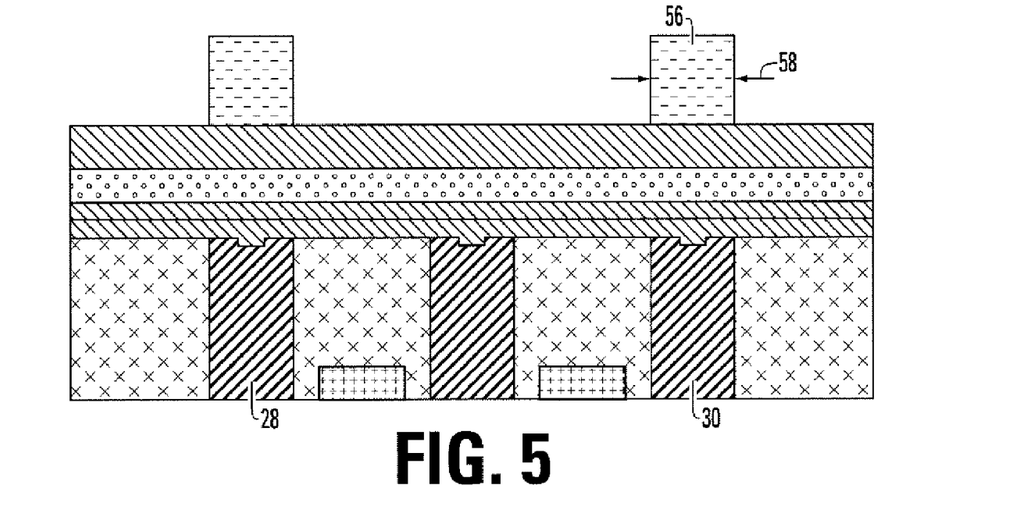
FIG. 5 shows a lithographic mask formed on the structure of FIG. 4.
Figure 6:
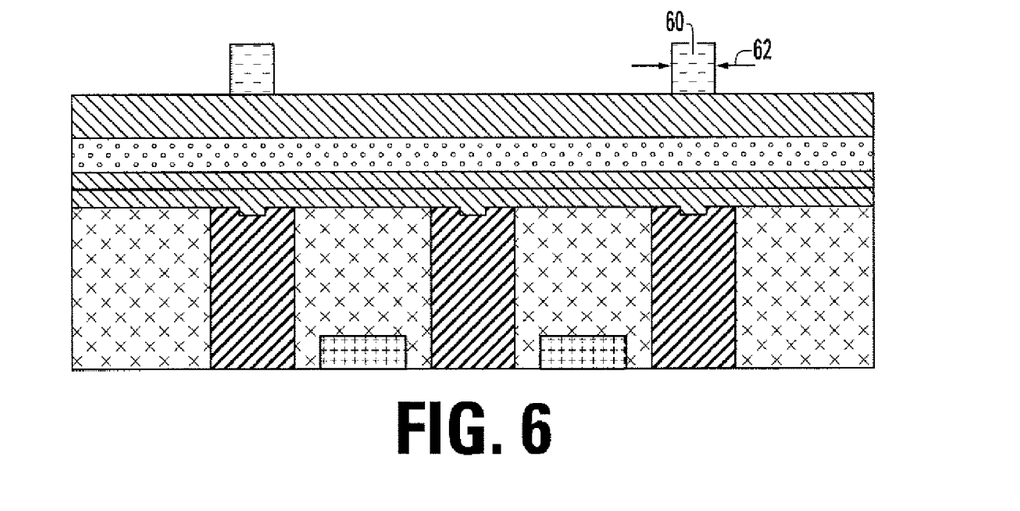
FIG. 6 illustrates the results of trimming the lithographic mask of FIG. 5.

FIG. 5 illustrates the results of the creation of a lithographic mask 56 generally centered over plugs 28, 30. Lithographic mask 56 typically has a lateral dimension 58 about equal to the minimum lithographic feature size for the lithographic process used. To reduce the lateral dimension 58 of lithographic mask 56, a mask trimming procedure is undertaken, the results of which creates the trimmed lithographic mask of 60 illustrated in FIG. 6. The lateral dimension 62 of trimmed lithographic mask 60 can therefore be smaller than the minimum lithographic feature size used to create lithographic mask 56. In one example lateral dimension 58 is preferably about 40 to 100 nm, and typically about 60 nm while lateral dimension 62 is preferably about 10 to 80 nm, and typically about 40 nm.

Figure 7:
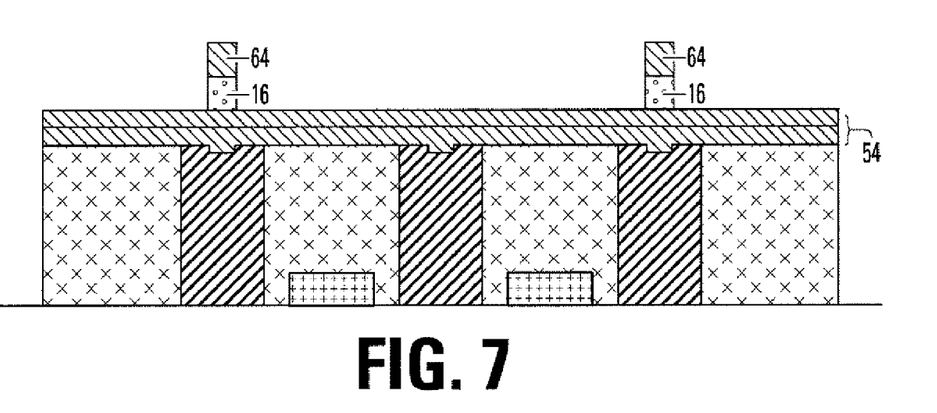
FIG. 7 shows the results of etching the structure of FIG. 6 and the subsequent removal of the trimmed lithographic mask.

FIG. 7 illustrates the results of etching second electrode layer 52 and memory material layer 50 and the subsequent removal of trimmed lithographic mask 60 to leave memory material elements 16 and second electrode elements 64. The etching process stops on the surface of the first electrode (typically of TiN) layer 54 by end point detection keying on GST or TiN etch signals in this example. This prevents damage to the memory material elements 16 during etching of the TiN, which may be etched much more slowly than the memory material GST and cause undercutting, or which may require changing to another chemistry that may undercut phase change material such as GST. The size of memory material elements 16 is minimized, typically to reduce the reset current required when the memory material is a phase change material, by minimizing the thickness of memory material layer 50 and by using trimmed lithographic mask 60.

Figure 8:
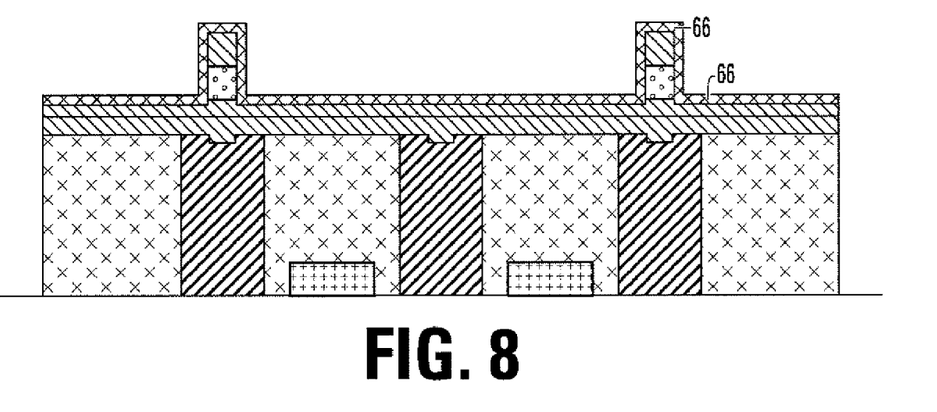
FIG. 8 illustrates a dielectric layer deposited onto the structure of FIG. 7.
Figure 9:
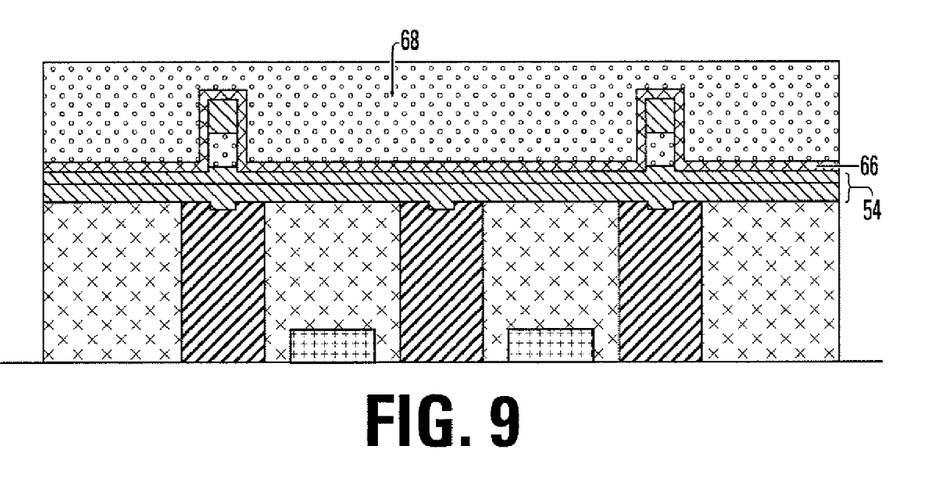
FIG. 9 illustrates a low thermal conductivity phase change material deposited onto the structure of FIG. 8.

FIG. 8 illustrates the results of the deposition of a dielectric layer 66 on the first electrode layer 54, memory material elements 16 and second electrode elements 64. Layer 66 provides protection for memory material element 16 during the subsequent TiN etch of first electrode layer 54, see FIGS. 12 and 13, and provides for electrical isolation. In FIG. 9 a lower thermal conductivity phase change material 68 is shown deposited on dielectric layer 66 filling in the region between elements 16 and 64. Material 68 is typically, but need not be, the same material as is memory material element 16. Material 68 is made of a memory material having good insulation qualities, including good thermal stability and a lower thermal conductivity than commonly used oxides such as $SiO_2$.

Figure 10:
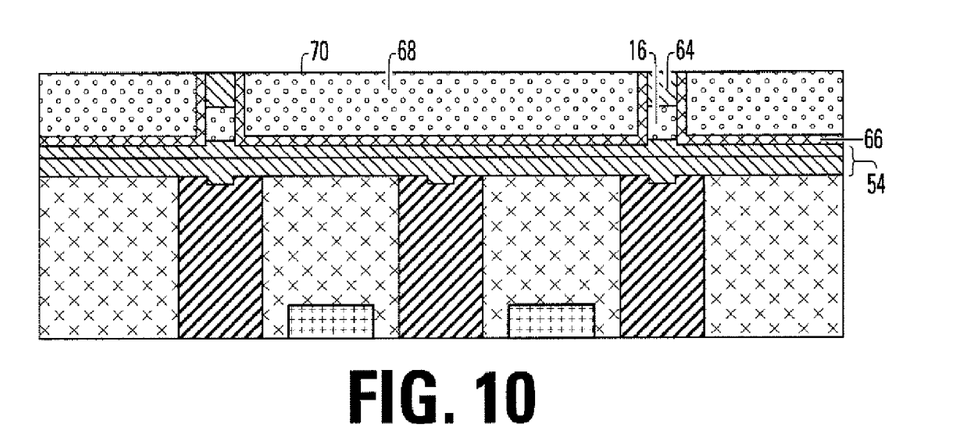
FIG. 10 illustrates the result of planarizing the structure of FIG. 9 to expose a second electrode element.
Figure 11:
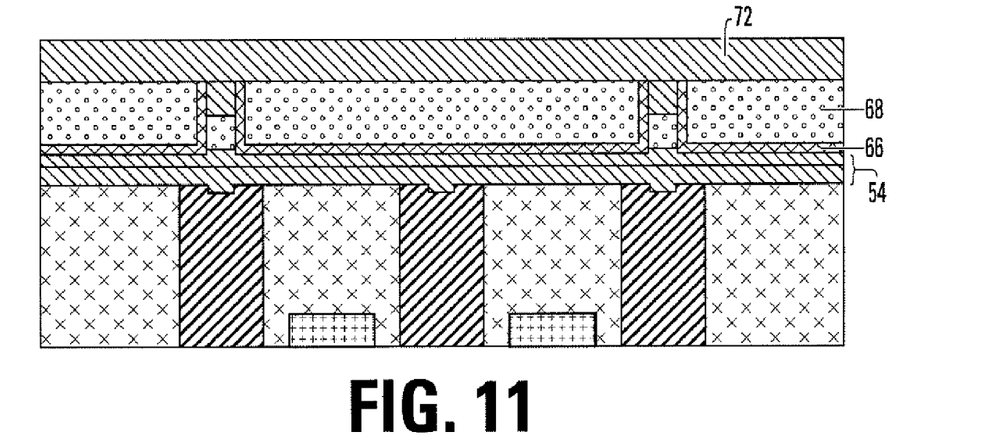
FIG. 11 shows the structure of FIG. 10 after deposition of an electrically conductive material onto the planarized surface.
Figure 12:
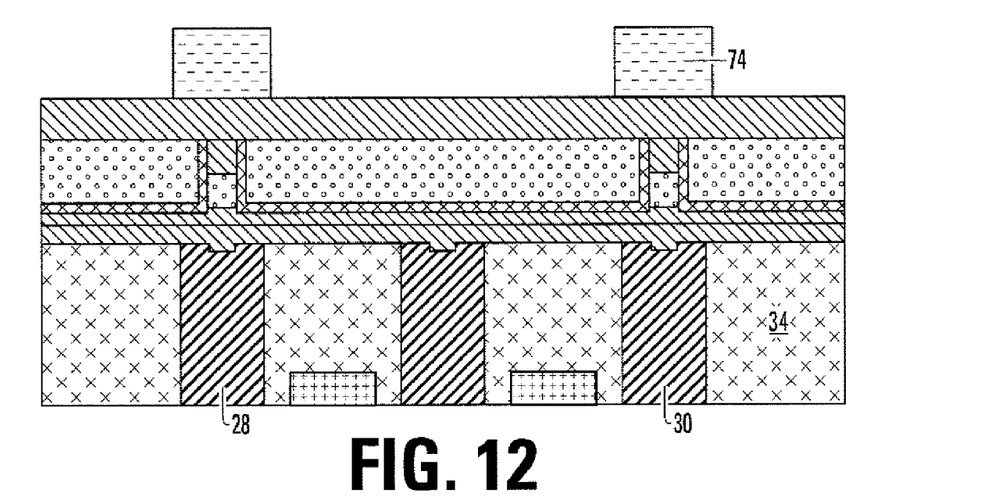
FIG. 12 illustrates a cell isolation lithographic mask formed on the structure of FIG. 11.
Figure 13:
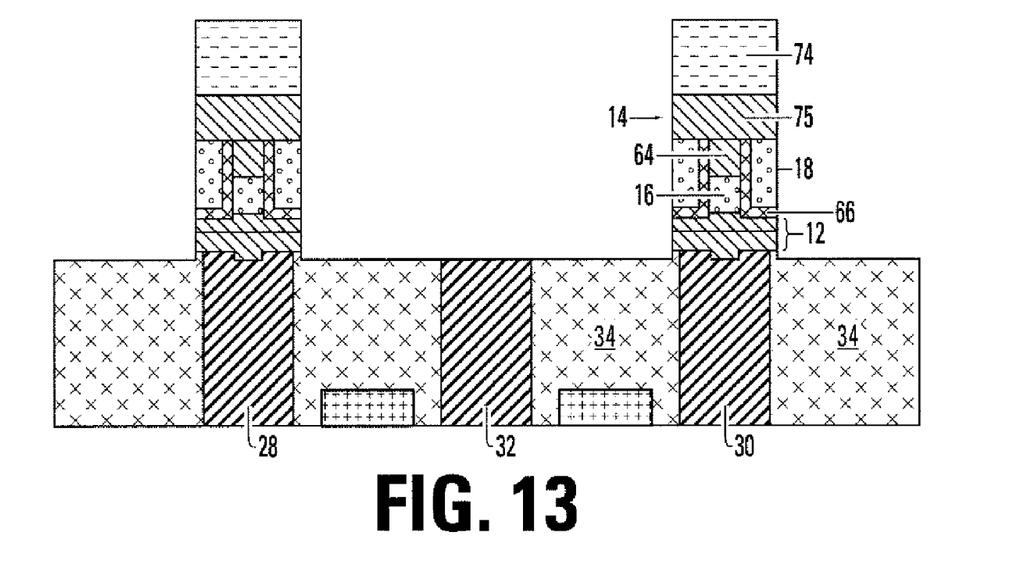
FIG. 13 illustrates result of etching the structure of FIG. 12 down to the dielectric film layer thereby creating the first and second electrodes.
Figure 14:
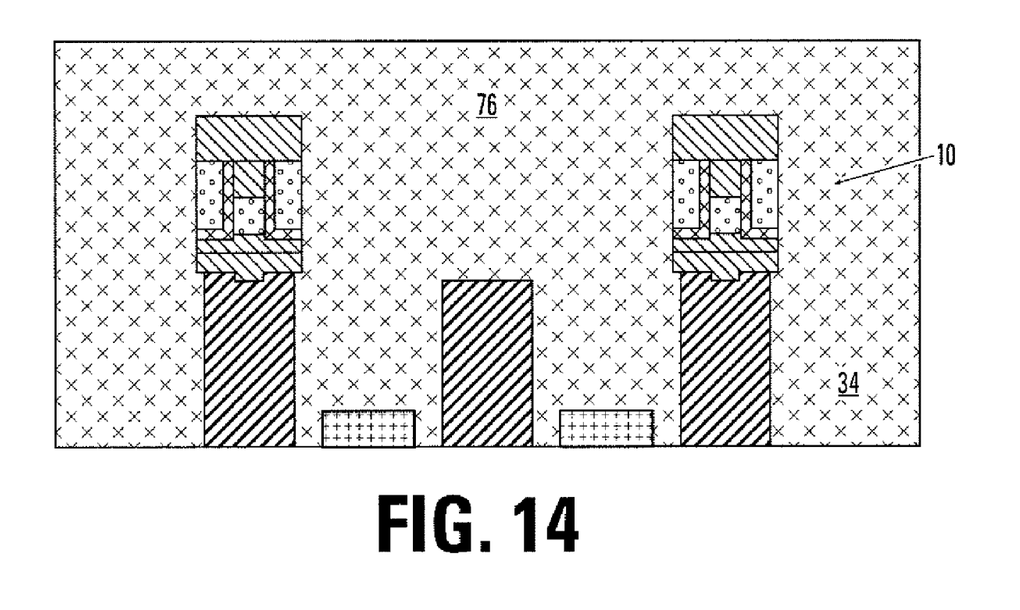
FIG. 14 shows the structure of FIG. 13 after deposition of a dielectric material.

The structure of FIG. 9 is subjected to a planarization procedure, typically chemical mechanical polishing (CMP), to arrive at the structure of FIG. 10. The planarization procedure removes portions of material 68 and dielectric layer 66, exposes second electrode elements 64 and creates a planarized surface 70. A supplemental second electrode layer 72 is deposited on surface 70. Layer 72 is typically an electrically conductive material such as TiN, although other electrically conductive materials can also be used. Thereafter a cell isolation lithographic mask 74 is created on top of layer 72 as shown in FIG. 12. An etching step, shown in FIG. 13, removes all material not masked by mask 74 down to dielectric film layer 34. This creates supplemental second electrode elements 75 which together with the second electrode elements 64 create second electrodes 14. The etching step of FIG. 13 also creates thermal insulation material 18 from material 68. Thereafter a dielectric material 76 is deposited onto the structure of FIG. 13 as shown in FIG. 14.

Thermal insulation material 18 is made of a memory material deposited using, for example, a conformal deposition process such as chemical vapor deposition (CVD). Thermal insulation material 18 is a better thermal insulator than dielectric material 76, preferably at least 10% better. Therefore, when dielectric material 76 comprises silicon dioxide, thermal insulation material 18 preferably has a thermal conductivity value "kappa" of less than that of silicon dioxide which is 0.014 J/cm*K*sec. In other preferred embodiments, thermal insulation material 18 has a thermal conductivity less than that of the amorphous state of the phase change material of memory material element 16, or less than about 0.003 J/cm*K*sec for a phase change material comprising GST. A single layer or combination of layers can provide thermal insulation.

Figure 15:
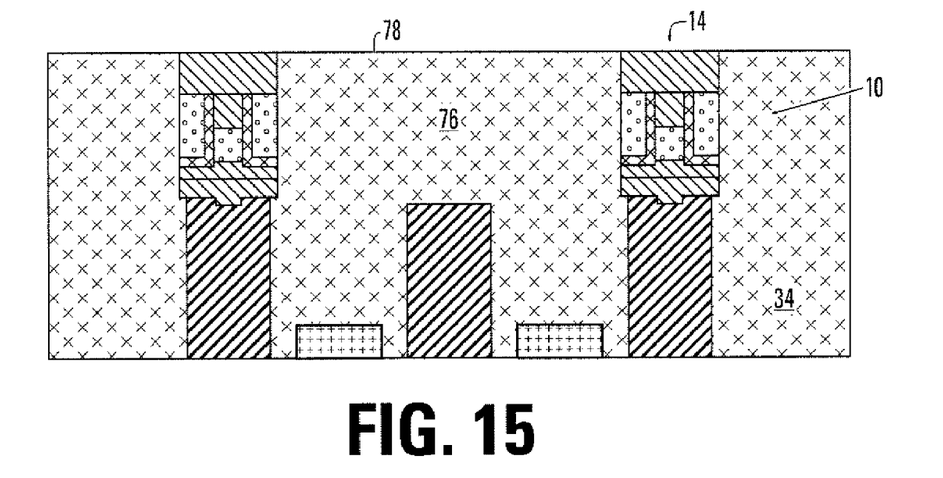
FIG. 15 shows the structure of FIG. 14 after planarization so to expose the second electrodes.
Figure 16:
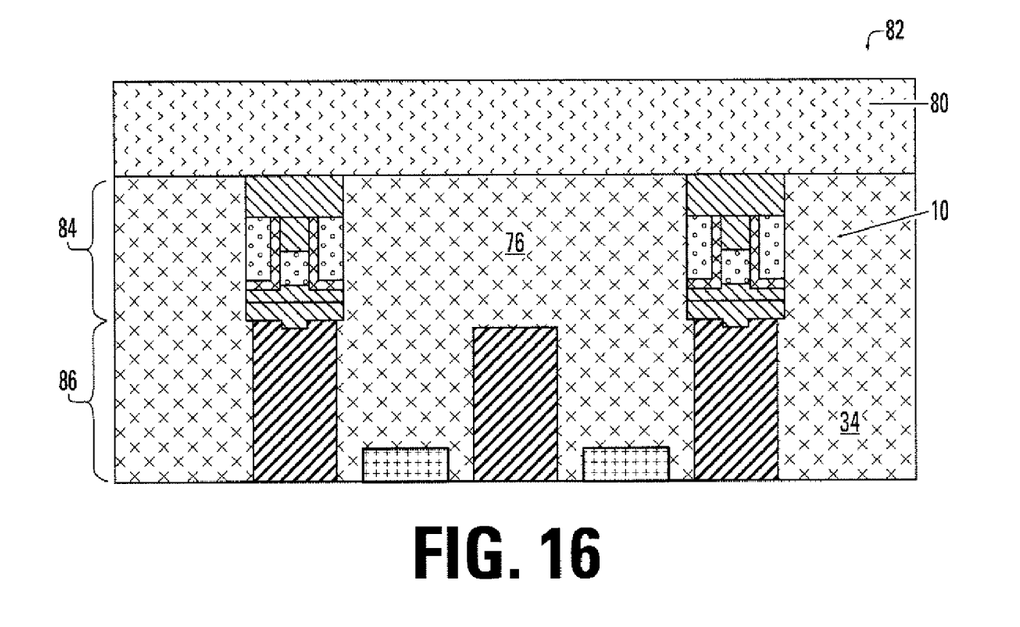
FIG. 16 illustrates an electrically conductive material deposited on the structure of FIG. 15.

Another planarization step, typically CMP, creates the structure of FIG. 15 to create a planarized surface 78 and to expose second electrode 14. Thereafter, an electrically conductive material 80, see FIG. 16, is deposited on surface 78 and patterned to create bit lines for a memory cell device 82, including memory cells 10, a memory cell layer 84 and a memory cell access layer 86. Electrically conductive material 80 is typically copper or aluminum, or alloys thereof, but it also may be tungsten, titanium nitride or other materials and combinations of materials.

The etching steps referred to above may be accomplished using a single etching procedure or a number of etching procedures using the same or different gases, flow rates, temperatures, etc.

Both the small size of memory material element 16 and the use of thermal insulation material 18 reduce the current needed to cause a change between electrical states, such as a lower resistivity, generally crystalline state and a higher resistivity, generally amorphous state when memory material element 16 is made of a phase change material such as GST.

Electrodes 12, 14 in the illustrated embodiments are preferably TiN. Although other materials, such as TaN, TiAlN or TaAlN, W and WN may be used for electrodes 12, 14, TiN is presently preferred because it makes good contact with GST (discussed below) as memory material element 16, it is a common material used in semiconductor manufacturing, and it provides a good diffusion barrier at the higher temperatures at which GST transitions, typically in the 600-700° C. range. Plugs 28, 30 and common source line 32 are typically made of tungsten.

Embodiments of memory material elements 16 include phase change based memory materials, including chalcogenide based materials and other materials, for memory material element 16. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb100_{-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, columns 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. A material useful for implementation of an RRAM device described herein is $Ge_2Sb_2Te_5$, commonly referred to as GST. Other types of phase change materials can also be used.

The invention has been described with reference to phase change materials. However, other memory materials, also sometimes referred to as programmable materials, can also be used. As used in this application, memory materials are those materials having electrical properties, such as resistance, that can be changed by the application of energy; the change can be a stepwise change or a continuous change or a combination thereof. Other programmable resistive memory materials may be used in other embodiments of the invention, including $N_2$ doped OST, $Ge_xSb_y$, or other material that uses different crystal phase changes to determine resistance; $Pr_xCa_yMnO_3$, PrSrMnO, $ZrO_x$, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, $C_{60}$-TCNQ, TCNQ doped with other metal, or any other polymer material that has bistable or multi-stable resistance state controlled by an electrical pulse. Further examples of programmable resistive memory materials include GeSbTe, GeSb, NiO, Nb—$SrTiO_3$, Ag—GeTe, PrCaMnO, ZnO, $Nb_2O_5$, Cr—$SrTiO_3$.

The following are short summaries describing four types of resistive memory materials.

1. Challecogenide material
$Ge_xSb_yTe_z$
x:y:z=2:2:5
Or other compositions with x: 0~5; y: 0~5; z: 0~10
GeSbTe with doping, such as N—, Si—, Ti—, or other element doping may also be used.
Formation method: By PVD sputtering or magnetron-sputtering method with reactive gases of Ar, $N_2$, and/or He, etc @ the pressure of 1 mtorr~100 mtorr. The deposition is usually done at room temperature. The collimator with aspect ratio of 1~5 can be used to improve the fill-in performance. To improve the fill-in performance, the DC bias of several ten to several hundred volts is also used. On the other hand, the combination of DC bias and the collimator can be used simultaneously.
The post deposition annealing treatment with vacuum or N2 ambient is sometimes needed to improve the crystallize state of chalcogenide material. The annealing temperature typically ranges 100 C to 400 C with an anneal time of less than 30 minutes.
The thickness of chalcogenide material depends on the design of cell structure. In general, a chalcogenide material with thickness of higher than 8 nm can have a phase change characterization so that the material exhibits at least two stable resistance states.
2. CMR (colossal magnetoresistance) material
$Pr_xCa_yMnO_3$
x:y=0.5:0.5
Or other compositions with x: 0~1; y: 0~1
Another CMR material that includes Mn oxide may be used
Formation method: By PVD sputtering or magnetron-sputtering method with reactive gases of Ar, $N_2$, $O_2$, and/or He, etc. at the pressure of 1 mtorr~100 mtorr. The deposition temperature can range from room temperature to ~600 C, depending on the post deposition treatment condition. A collimator with an aspect ratio of 1~5 can be used to improve the fill-in performance. To improve the fill-in performance, the DC bias of several ten to several hundred volts is also used. On the other hand, the combination of DC bias and the collimator can be used simultaneously. A magnetic field of several ten gauss to 10,000 gauss may be applied to improve the magnetic crystallized phase.
The post deposition annealing treatment with vacuum or $N_2$ ambient or $O_2/N_2$ mixed ambient may be needed to improve the crystallized state of CMR material. The annealing temperature typically ranges 400 C to 600 C with an anneal time of less than 2 hours.
The thickness of CMR material depends on the design of cell structure. The CMR thickness of 10 nm to 200 nm can be used to be the core material.
A buffer layer of YBCO (YBaCuO3, a kind of high temperature superconductor material) is often used to improve the crystallized state of CMR material. The YBCO is deposited before the deposition of CMR material. The thickness of YBCO ranges 30 nm to 200 nm.
3. 2-element compound
$Ni_xO_y$; $Ti_xO_y$; $Al_xO_y$; $W_xO_y$; $Zn_xO_y$; $Zr_xO_y$; $Cu_xO_y$; etc
x:y=0.5:0.5
Other compositions with x: 0~1; y: 0~1
Formation method:
1. Deposition: By PVD sputtering or magnetron-sputtering method with reactive gases of Ar, $N_2$, $O_2$, and/or He, etc. at the pressure of 1 mtorr~100 mtorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimator with an aspect ratio of 1~5 can be used to improve the fill-in performance. To improve the fill-in performance, the DC bias of several ten to several hundred volts is also used. If desired, they combination of DC bias and the collimator can be used simultaneously.

The post deposition annealing treatment with vacuum or $N_2$ ambient or $O_2/N_2$ mixed ambient as sometimes needed to improve the oxygen distribution of metal oxide. The annealing temperature ranges 400 C to 600 C with an anneal time of less than 2 hours.

2. Reactive deposition: By PVD sputtering or magnetron-sputtering method with reactive gases of $Ar/O_2$, $Ar/N_2/O_2$, pure $O_2$, $He/O_2$, $HeN_2/O_2$ etc. at the pressure of 1 mtorr~100 mtorr, using a target of metal oxide, such as Ni, Ti, Al, W, Zn, Zr, or Cu etc. The deposition is usually done at room temperature. A collimator with an aspect ratio of 1~5 can be used to improve the fill-in performance. To improve the fill-in performance, a DC bias of several ten to several hundred volts is also used. If desired, the combination of DC bias and the collimator can be used simultaneously.

The post deposition annealing treatment with vacuum or $N_2$ ambient or $O_2/N_2$ mixed ambient is sometimes needed to improve the oxygen distribution of metal oxide. The annealing temperature ranges 400 C to 600 C with an anneal time of less than 2 hours.

3. Oxidation: By a high temperature oxidation system, such as furnace or RTP system. The temperature ranges from 200 C to 700 C with pure $O_2$ or $N_2/O_2$ mixed gas at a pressure of several mtorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mtorr to 100 mtorr is used to oxidize the surface of metal, such as Ni, Ti, Al, W, Zn, Zr, or Cu etc. The oxidation time ranges several seconds to several minutes. The oxidation temperature ranges room temperature to 300 C, depending on the degree of plasma oxidation.

4. Polymer material

TCNQ with doping of Cu, $C_{60}$, Ag etc.

PCBM-TCNQ mixed polymer

Formation method:

1. Evaporation: By thermal evaporation, e-beam evaporation, or molecular beam epitaxy (MBE) system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of 10-4 torr to 10-10 torr. The wafer temperature ranges from room temperature to 200 C.

The post deposition annealing treatment with vacuum or $N_2$ ambient is sometimes needed to improve the composition distribution of polymer material. The annealing temperature ranges room temperature to 300 C with an anneal time of less than 1 hour.

2. Spin-coat: By a spin-coater with the doped-TCNQ solution @ the rotation of less than 1000 rpm. After spin-coating, the wafer is put to wait the solid-state formation @ room temperature or temperature of less than 200 C. The waiting time ranges from several minutes to days, depending on the temperature and on the formation conditions.

For additional information on the manufacture, component materials, use and operation of phase change random access memory devices, see U.S. patent application Ser. No. 11/155,067, filed 17 Jun. 2005, entitled Thin Film Fuse Phase Change Ram And Manufacturing Method.

The above descriptions may have used terms such as above, below, top, bottom, over, under, et cetera. These terms are used to aid understanding of the invention are not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are hereby incorporated by reference.

What is claimed is:

1. A memory cell, the memory cell being part of a memory cell device, comprising:
   first and second electrodes;
   a memory material element electrically coupling the first and second electrodes;
   the memory material element comprising a first memory material, the first memory material comprising a phase change memory material;
   a thermal insulating layer surrounding the memory material element;
   the thermal insulating layer comprising a second memory material, the second memory material comprising a second phase change memory material comprising a chalcogenide; and
   a dielectric layer separating and electrically insulating the thermal insulating layer from the memory material element.

2. The memory cell according to claim 1 wherein the first and second electrodes comprise portions contacting the memory material element, said portions comprising TiN.

3. The memory cell according to claim 1 wherein the first and second memory materials are the same memory material.

4. The memory cell according to claim 1 wherein the first memory material comprises GST.

5. The memory cell according to claim 1 wherein the second memory material is electrically isolated from at least one of the first and second electrodes.

6. The memory cell according to claim 1 wherein the dielectric layer electrically isolates the second memory material from at least one of the first and second electrodes.

7. The memory cell according to claim 1 wherein:
   the first memory material has a thermal conductivity and a thermal expansion coefficient;
   the second memory material has a thermal conductivity less than or equal to the thermal conductivity of the first memory material; and
   the second memory material has a thermal expansion coefficient equal to or within 5% of the thermal expansion coefficient of the first memory material.

8. The memory cell according to claim 1 wherein:
   the second memory material is at least a 1000 better thermal insulator than the dielectric layer; and
   the thermal expansion coefficient of the second memory material is within 5% of the thermal expansion coefficient of the first memory material.

9. A memory cell, the memory cell being part of a memory cell device, comprising:
   first and second electrodes;
   a memory material element electrically coupling the first and second electrodes;
   the memory material element comprising a first phase change memory material having a thermal conductivity and a thermal expansion coefficient;
   a thermal insulating layer surrounding the memory material element;
   the thermal insulating layer comprising a second phase change memory material having a thermal conductivity less than or equal to the thermal conductivity of the first phase change memory material and having a thermal expansion coefficient equal to or within 5% of the thermal expansion coefficient of the first phase change memory material; and
   a dielectric layer separating the thermal insulating layer from the memory material element.

10. The memory cell according to claim 9 wherein the first and second electrodes comprise portions contacting the memory material element, said portions comprising TiN.

11. The memory cell according to claim 9 wherein the first and second phase change memory materials are the same material.

12. The memory cell according to claim 9 wherein the first phase change memory material comprises GST.

13. The memory cell according to claim 9 wherein the second phase change memory material is electrically isolated from at least one of the first and second electrodes.

14. The memory cell according to claim 9 wherein the dielectric layer electrically isolates the second phase change memory material from at least one of the first and second electrodes.

15. A memory cell, the memory cell being part of a memory cell device, comprising:
   first and second electrodes;
   a memory material element electrically coupling the first and second electrodes;
   the memory material element comprising a first phase change memory material having a thermal conductivity and a thermal expansion coefficient;
   a thermal insulating layer surrounding the memory material element;
   the thermal insulating layer comprising a second phase change memory material having a thermal expansion coefficient within 5% of the thermal expansion coefficient of the first phase change memory material; and
   a dielectric layer separating the thermal insulating layer from the memory material element,
   wherein the second phase change material is at least a 10% better thermal insulator than the dielectric layer.

16. The memory cell according to claim 15 wherein the first and second electrodes comprise portions contacting the memory material element, said portions comprising TiN.

17. The memory cell according to claim 15 wherein the first and second phase change memory materials are the same material.

18. The memory cell according to claim 15 wherein the first phase change memory material comprises GST.

19. The memory cell according to claim 15 wherein the second phase change memory material is electrically isolated from at least one of the first and second electrodes.

20. The memory cell according to claim 15 wherein the dielectric layer electrically isolates the second phase change memory material from at least one of the first and second electrodes.

21. A memory cell, the memory cell being part of a memory cell device, comprising:
   first and second electrodes;
   a memory material element electrically coupling the first and second electrodes;
   the memory material element comprising a first programmable phase change memory material;
   a thermal insulating layer completely surrounding the memory material element;
   the thermal insulating layer comprising a second programmable phase change memory material; and
   a dielectric layer completely separating the thermal insulating layer from the memory material element.

22. The memory cell according to claim 21 wherein the first and second electrodes comprise portions contacting the memory material element, said portions comprising TiN.

23. The memory cell according to claim 21 wherein the first and second phase change memory materials are the same material.

24. The memory cell according to claim 21 wherein the first phase change memory material comprises GST.

25. The memory cell according to claim 21 wherein the second phase change memory material is electrically isolated from at least one of the first and second electrodes.

26. The memory cell according to claim 21 wherein the dielectric layer electrically isolates the second phase change memory material from at least one of the first and second electrodes.

27. The memory cell according to claim 21 wherein:
   the first phase change memory material has a thermal conductivity and a thermal expansion coefficient;
   the second phase change memory material has a thermal conductivity less than or equal to the thermal conductivity of the first phase change memory material; and
   the second phase change memory material has a thermal expansion coefficient equal to or within 5% of the thermal expansion coefficient of the first phase change memory material.

28. The memory cell according to claim 21 wherein:
   the second phase change memory material is at least a 10% better thermal insulator than the dielectric layer; and
   the thermal expansion coefficient of the second phase change memory material is within 5% of the thermal expansion coefficient of the first phase change memory material.

\* \* \* \* \*

UNITED STATES PATENT AND TRADEMARK OFFICE
CERTIFICATE OF CORRECTION

PATENT NO. : 7,696,506 B2
APPLICATION NO. : 11/426771
DATED : April 13, 2010
INVENTOR(S) : Hsiang-Lan Lung Page 1 of 1

It is certified that error appears in the above-identified patent and that said Letters Patent is hereby corrected as shown below:

Col. 10, line 62, delete "1000" and insert -- 10% --

Signed and Sealed this

Eighth Day of June, 2010

David J. Kappos
*Director of the United States Patent and Trademark Office*